(12) United States Patent
Cheng et al.

(10) Patent No.: US 11,430,780 B2
(45) Date of Patent: Aug. 30, 2022

(54) TVS DEVICE AND MANUFACTURING METHOD THEREFOR

(71) Applicant: CSMC TECHNOLOGIES FAB2 CO., LTD., Wuxi (CN)

(72) Inventors: Shikang Cheng, Wuxi (CN); Yan Gu, Wuxi (CN); Sen Zhang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 30 days.

(21) Appl. No.: 17/266,134

(22) PCT Filed: Nov. 1, 2019

(86) PCT No.: PCT/CN2019/114924
§ 371 (c)(1),
(2) Date: Feb. 5, 2021

(87) PCT Pub. No.: WO2020/093935
PCT Pub. Date: May 14, 2020

(65) Prior Publication Data
US 2021/0358903 A1 Nov. 18, 2021

(30) Foreign Application Priority Data

Nov. 6, 2018 (CN) .......................... 201811313508.1

(51) Int. Cl.
*H01L 27/02* (2006.01)
*H01L 21/266* (2006.01)
(Continued)

(52) U.S. Cl.
CPC ........ *H01L 27/0248* (2013.01); *H01L 21/266* (2013.01); *H01L 29/0611* (2013.01); *H01L 29/7412* (2013.01); *H01L 29/866* (2013.01)

(58) Field of Classification Search
CPC ............. H01L 27/0248; H01L 29/0611; H01L 29/7412; H01L 29/866
See application file for complete search history.

(56) References Cited

U.S. PATENT DOCUMENTS 8,896,093 B2 11/2014 Mallikarajunasway et al.

FOREIGN PATENT DOCUMENTS

| CN | 205039152 U | 2/2016 |
| CN | 106057796 A | 10/2016 |
| CN | 207624703 U | 7/2018 |

OTHER PUBLICATIONS

PCT International Search Report for corresponding PCT Application No. PCT/CN2019/114924, dated Jan. 22, 2020, 9 pages.

*Primary Examiner* — Syed I Gheyas
(74) *Attorney, Agent, or Firm* — Dority & Manning, P.A.

(57) ABSTRACT

A TVS device and a manufacturing method therefor. The TVS device comprises: a first doping type semiconductor substrate (100); a second doping type deep well I (101), a second doping type deep well II (102), and a first doping type deep well (103) provided on the semiconductor substrate; a second doping type heavily doped region I (104) provided in the second doping type deep well I (101); a first doping type well region (105) and a first doping type heavily doped region I (106) provided in the second doping type deep well II (102); a first doping type heavily doped region II (107) and a second doping type heavily doped region II (108) provided in the first doping type deep well (105); a second doping type heavily doped region III (109) located in the first doping type well region (105) and the second doping type deep well II (102); and a first doping type doped region (110) provided in the first doping type well region (105).

15 Claims, 5 Drawing Sheets

(51) Int. Cl.
*H01L 29/06* (2006.01)
*H01L 29/74* (2006.01)
*H01L 29/866* (2006.01)

TVS DEVICE AND MANUFACTURING METHOD THEREFOR

CROSS REFERENCES TO RELATED APPLICATION

This patent application claims priority to Chinese patent application No. 2018113135081, filed on Nov. 6, 2018, entitled "TVS DEVICE AND MANUFACTURING METHOD THEREFOR" the disclosure of which is hereby incorporated by reference in its entirety.

TECHNICAL FIELD

The present disclosure relates to the field of semiconductor technology, and particularly relates to a TVS device and a manufacturing method therefor.

BACKGROUND

In a whole machine and system, unexpected voltage transients and surges are often encountered, causing semiconductor devices in the whole machine and system to be burned down or broken down, resulting in damage of the whole machine and system. Therefore, Transient Voltage Suppressor (TVS) as a silicon PN junction high-efficiency protection device, due to its fast response time and strong ESD resistance, is widely used in various I/O interfaces.

At present, the transmission rate of high-speed interfaces represented by High-Definition Multimedia Interface (HDMI) is getting faster and faster, even as high as 5 Gbps. In order to ensure data integrity, there are extremely strict requirements for the capacitance of ESD protection at the interface. In addition, in an actual driver chip, the number of pins is as many as hundreds, and an ESD risk exist in each of the pins. In order to protect as many I/O ports as possible while not occupying too much area, there are higher requirements for the integration of TVS.

SUMMARY

In the section of the summary, a series of simplified concepts are introduced, which will be described in further detail in the section of the detailed description of the embodiments. The section of the summary of the present disclosure does not mean an attempt to limit the key features and necessary technical features of the claimed technical solution, nor does it mean an attempt to determine the protection scope of the claimed technical solution.

The present disclosure provides a TVS device, and the TVS device includes:

a first-doping-type semiconductor substrate;

a first second-doping-type deep well and a second second-doping-type deep well disposed on the first-doping-type semiconductor substrate, and a first-doping-type deep well located between the first second-doping-type deep well and the second second-doping-type deep well;

a first second-doping-type heavily doped region disposed in the first second-doping-type deep well;

a first-doping-type well region and a first first-doping-type heavily doped region disposed in the second second-doping-type deep well;

a second first-doping-type heavily doped region and a second second-doping-type heavily doped region disposed in the first-doping-type well region;

a third second-doping-type heavily doped region partially located in the first-doping-type well region and partially located in the second second-doping-type deep well; and a first-doping-type doped region disposed in the first-doping-type well region and in contact with the third second-doping-type heavily doped region.

The present disclosure further provides a manufacturing method for a TVS device, and the manufacturing method includes:

providing a first-doping-type semiconductor substrate;

performing ion implantation to form a first second-doping-type ion implantation region, a second second-doping-type ion implantation region, and a first first-doping-type ion implantation region located between the first second-doping-type ion implantation region and the second second-doping-type ion implantation region on the first-doping-type semiconductor substrate;

performing a high-temperature drive-in process to form a first second-doping-type deep well, a second second-doping-type deep well, and a first-doping-type deep well located between the first second-doping-type deep well and the second second-doping-type deep well;

forming a first-doping-type well region in the second second-doping-type deep well;

performing ion implantation to form a first second-doping-type heavily doped region located in the first second-doping-type deep well, a second second-doping-type heavily doped region located in the first-doping-type well region, a third second-doping-type heavily doped region partially located in the first-doping-type well region and partially located in the second second-doping-type deep well, and a first first-doping-type heavily doped region located in the second second-doping-type deep well and a second first-doping-type heavily doped region located in the first-doping-type well region; and performing first-doping-type ion implantation to form a first-doping-type doped region in the first-doping-type well region, the first-doping-type doped region being in contact with the third second-doping-type heavily doped region.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

The following drawings of the present disclosure are used herein as part of the present disclosure to understand the present disclosure. Embodiments of the present disclosure and description thereof are illustrated in the accompanying drawings to explain the principle of the present disclosure.

In the accompanying drawings.

DETAILED DESCRIPTION

Figure 1:
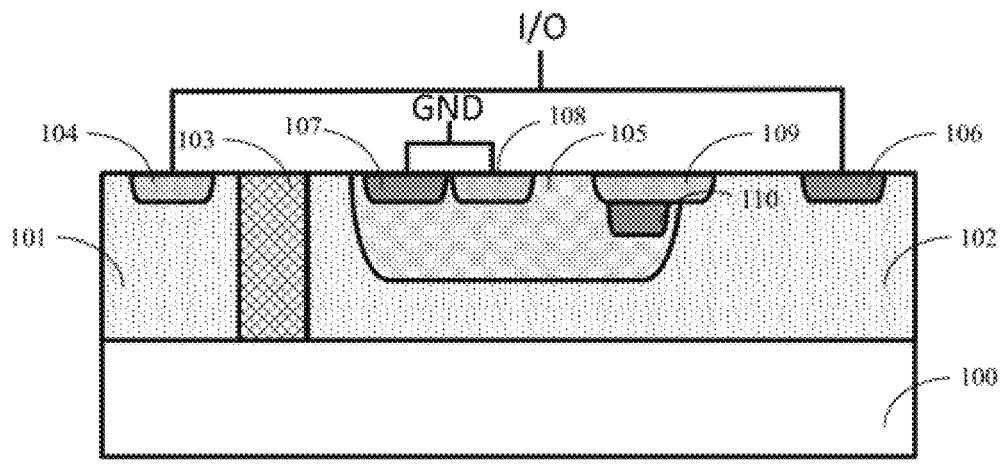
FIG. 1 shows a cross-sectional view of a TVS device provided by an embodiment of the present disclosure.

In order to increase the current capability of ESD, the junction area of the TVS device is usually increased, which will lead to a significant increase in electric leakage, thus resulting that the static power consumption of the device is also obviously increased. Therefore, in order to solve the above problem, it is necessary to propose a new TVS device and a manufacturing method therefor.

The embodiments of the present disclosure are described here with reference to cross-sectional views which are schematic diagrams of ideal embodiments (and intermediate structures) of the present disclosure. In this way, changes from the shown shape due to, for example, manufacturing technology and/or tolerances can be expected. Therefore, the embodiments of the present disclosure should not be limited to the specific shapes of the regions shown here, but include shape deviations due to, for example, manufacturing. For example, an implanted region shown as a rectangle usually has round or curved features and/or implant concentration gradients at its edges, rather than a binary change from an implanted region to a non-implanted region. Likewise, a buried region formed by the implantation may result in some implantation in the region between the buried region and the surface passed through when the implantation is performed. Therefore, the regions shown in the figures are substantially schematic, and their shapes are not intended to show the actual shape of the regions of the device and are not intended to limit the scope of the present disclosure.

In order to thoroughly understand the present disclosure, detailed structures will be set forth in the following description, so as to explain the technical solutions proposed by the present disclosure. Preferred embodiments of the present disclosure are described in detail below, however in addition to these detailed descriptions, the present disclosure may have other embodiments.

The TVS capacitance formed by a single avalanche diode is quite large, generally at least tens of picofarads. As the ESD capability increases, the capacitance also increases by the same proportion. When used in a high-speed interface, it will seriously affect the integrity of the data. For the existing TVS devices, one way is to integrate a low-capacitance diode and a TVS avalanche diode on one same chip by implanting a buried layer and growing high-resistivity epitaxy, but the cost thereof is relatively high, and the production and control of the high-resistivity epitaxy process is relatively difficult. The other way is to distribute diodes on the surface of the chip by using a conventional CMOS process, TVS manufactured in this way has the following disadvantages: 1. since in the conventional CMOS process, the concentration of the well is generally relatively large and the junction depth is relatively shallow, its parasitic capacitance is very large, which cannot meet the requirements for capacitance in the current high-speed interfaces; 2. different diodes are isolated by a conventional P type semiconductor substrate, and the isolation effect is poor, the parasitic BJT is easy to turn on, which leads to a poor ESD robustness performance; 3. currently on the market, a forward low-capacitance diode is generally connected in series with a TVS avalanche diode, and then they are together connected in parallel to another low-capacitance reverse diode so as to achieve a unidirectional low-capacitance TVS, however, smaller capacitance is required for the application of ultra-high-speed I/O ports, and conventional diodes can no longer meet the demand.

In view of the above problems, the present disclosure provides a TVS device, including: a first-doping-type semiconductor substrate; a first second-doping-type deep well and a second second-doping-type deep well disposed on the first-doping-type semiconductor substrate, and a first-doping-type deep well located between the first second-doping-type deep well and the second second-doping-type deep well; a first second-doping-type heavily doped region disposed in the first second-doping-type deep well; a first-doping-type well region and a first first-doping-type heavily doped region disposed in the second second-doping-type deep well; a second first-doping-type heavily doped region and a second second-doping-type heavily doped region disposed in the first-doping-type well region; a third second-doping-type heavily doped region partially located in the first-doping-type well region and partially located in the second second-doping-type deep well; and a first-doping-type doped region disposed in the first-doping-type well region and in contact with the third second-doping-type heavily doped region.

The present disclosure further provides a manufacturing method for a TVS device, including: provide a first-doping-type semiconductor substrate; perform ion implantation to form a first second-doping-type ion implantation region, a second second-doping-type ion implantation region, and a first first-doping-type ion implantation region located between the first second-doping-type ion implantation region and the second second-doping-type ion implantation region on the first-doping-type semiconductor substrate; perform a high-temperature drive-in process to form a first second-doping-type deep well, a second second-doping-type deep well, and a first-doping-type deep well located between the first second-doping-type deep well and the second second-doping-type deep well; form a first-doping-type well region in the second second-doping-type deep well; perform ion implantation to form a first second-doping-type heavily doped region in the first second-doping-type deep well, a second second-doping-type heavily doped region located in the first-doping-type well region, and a third second-doping-type heavily doped region partially located in the first-doping-type well region and partially located in the second second-doping-type deep well, and a first first-doping-type heavily doped region located in the second second-doping-type deep well and a second first-doping-type heavily doped region located in the first-doping-type well region; and perform first-doping-type ion implantation to form a first-doping-type doped region in contact with the third second-doping-type heavily doped region in the first-doping-type well region.

The TVS device provided by the present disclosure has simple structure, low cost, good isolation effect, high ESD robustness, and easily integrated, and a parasitic SCR is used to replace a conventional PN junction forward diode, thus its current discharge capability is stronger and capacitance is smaller. In the manufacturing method provided by the present disclosure, the high-temperature drive-in is used to simultaneously form a deep N well and a deep P well, which can not only further reduce the parasitic capacitance of the device, but also can reduce the lateral expansion size of the deep well, significantly reduce the integration area of the TVS chip, and effectively reduce the manufacturing cost.

In order to thoroughly understand the present disclosure, detailed structures and/or steps will be set forth in the following description, so as to explain the technical solutions proposed by the present disclosure. Preferred embodiments of the present disclosure are described in detail below, however in addition to these detailed description, the present disclosure may have other embodiments.

Hereinafter, a TVS device according to an implementation of the present disclosure will be described in detail with reference to FIGS. 1-3.

As shown in FIG. 1, a TVS device according to an embodiment of the present disclosure includes: a first-doping-type semiconductor substrate 100; a first second-doping-type deep well 101 and a second second-doping-type deep well 102 disposed on the semiconductor substrate 100, and a first-doping-type deep well 103 disposed between the first second-doping-type deep well 101 and the second second-doping-type deep well 102; a first second-doping-type heavily doped region 104 disposed in the first second-doping-type deep well 101; a first-doping-type well region 105 and a first first-doping-type heavily doped region 106 disposed in the second second-doping-type deep well 102; a second first-doping-type heavily doped region 107 and a second second-doping-type heavily doped region 108 disposed in the first-doping-type well region 105; a third second-doping-type heavily doped region 109 partially located in the first-doping-type well region 105 and partially located in the second second-doping-type deep well 102; and a first-doping-type doped region 110 disposed in the first-doping-type well region 105 and in contact with the third second-doping-type heavily doped region 109. The first second-doping-type heavily doped region 104 and the first first-doping-type heavily doped region 106 are connected to an input/output terminal (I/O), and the second first-doping-type heavily doped region 107 and the second second-doping-type heavily doped region 108 are connected to a ground terminal (GND).

It should be noted that the first doping type and the second doping type in this specification generally refer to P type or N type. For example, the first doping type is one of P type, lightly doped P− type, and heavily doped P+ type, and the second doping type is one of N type, lightly doped N− type, and heavily doped N+ type. Or conversely, the first doping type is one of N type, lightly doped N− type, and heavily doped N+ type, and the second doping type is one of P type, lightly doped P− type, and heavily doped P+ type.

In this embodiment, the description is made with the first-doping-type being P type and the second-doping-type being N type. That is, the semiconductor substrate 100 is a P type doped semiconductor substrate, and the first second-doping-type deep well 101 and the second second-doping-type deep well 102 are deep N wells, the first-doping-type deep well 103 is a deep P well; the first second-doping-type heavily doped region 104, the second second-doping-type heavily doped region 108, and the third second-doping-type heavily doped region 109 are N+ source regions; the first first-doping-type heavily doped region 106 and the second first-doping-type heavily doped region 107 are P+ source region; the first-doping-type well region 105 is a P type well region; and the first-doping-type doped region 110 is a P type doped region, which is used to form a P type implanted region of a Zener diode.

Specifically, a constituent material of the semiconductor substrate 100 may include semiconductor elements, such as silicon or silicon germanium with a single crystal, polycrystalline, or amorphous structure, and may also include mixed semiconductor structures, such as silicon carbide, indium antimonide, indium arsenide, indium phosphide, gallium arsenide or gallium antimonide, alloy semiconductor, or a combination thereof, or may be Silicon-On-Insulator (SOI), or the like. Exemplarily, the semiconductor substrate is a P type lightly doped substrate, that is, a P− substrate.

The first second-doping-type deep well 101, the second second-doping-type deep well 102, and the first-doping-type deep well 103 are disposed in sequence on the surface of the semiconductor substrate. The first-doping-type deep well is disposed between the first second-doping-type deep well 101 and the second second-doping-type deep well 102, and is in contact with the first second-doping-type deep well 101 and the second second-doping-type deep well 102, respectively. Exemplarily, the first second-doping-type deep well 101, the second second-doping-type deep well 102, and the first-doping-type deep well 103 can be formed by a high-temperature drive-in process, and their junction depths are between 5 um and 15 um. Compared with a TVS device isolated by a conventional P type semiconductor substrate, using the second-doping-type deep well and the first-doping-type deep well for isolation can improve the isolation effect, thereby further reducing the parasitic capacitance and reducing the turn-on of the parasitic BJT, and improving the ESD robustness performance, and since the junction depths of the second-doping-type deep well and the first-doping-type deep well are relatively deep, and the lateral expansion sizes thereof are relatively small, the size of the device can be further reduced.

The first second-doping-type heavily doped region 104 is formed in the first second-doping-type deep well 101. Exemplarily, the doping ions of the first second-doping-type heavily doped region 104 include arsenic ions and phosphorus ions. The operating voltage of the device can be adjusted by adjusting the doping concentration of arsenic ions and phosphorus ions. The higher the doping concentration, the lower the operating voltage. Exemplarily, the doping concentration of arsenic ions may be 5E15 $cm^{-3}$ to 1E16 $cm^{-3}$, and the doping concentration of phosphorus ions may be 1E14 $cm^{-3}$ to 1E15 $cm^{-3}$.

The first-doping-type well region 105 and the first first-doping-type heavily doped region 106 independent from each other are formed in the second second-doping-type deep well 102. Exemplarily, the first-doping-type well region 105 may also be formed by a high-temperature drive-in process, and the doping concentration thereof is, for example, 1E13 $cm^{-3}$ to 1E14 $cm^{-3}$. The doping ions of the first first-doping-type heavily doped region 106 include boron difluoride ions, and the contact resistance between the first first-doping-type heavily doped region 106 and an interconnection line can be adjusted by adjusting the doping concentration of the boron difluoride ions. The higher the doping concentration, the lower the contact resistance. Exemplarily, the doping concentration of the doping ions of the first first-doping-type heavily doped region 106 is 1E15 $cm^{-3}$ to 1E16 $cm^{-3}$.

The second first-doping-type heavily doped region 107, the second second-doping-type heavily doped region 108, the third second-doping-type heavily doped region 109, and the first-doping-type doped region 110 are formed in sequence in the first-doping-type well region 105. The second first-doping-type heavily doped region 107 is formed at a side near the first-doping-type deep well 103. The third second-doping-type heavily doped region 109 is formed at a side near the first first-doping-type heavily doped region 106, and is partially located in the first-doping-type well region 105 and partially located in the second second-doping-type deep well 102. The first-doping-type doped region 110 is in contact with the third second-doping-type heavily doped region 109. Illustratively, the first-doping-type doped region 110 is disposed below the third seconddoping-type heavily doped region 109. Exemplarily, the doping ions of the first-doping-type doped region 110 include phosphorus ions and boron ions, and the doping concentration of the phosphorus ions is, for example, 1E13 cm$^{-3}$ to 1E14 cm$^{-3}$, and the doping concentration of boron ions is, for example, 1E14 cm$^{-3}$ to 1E15 cm$^{-3}$.

Figure 2:
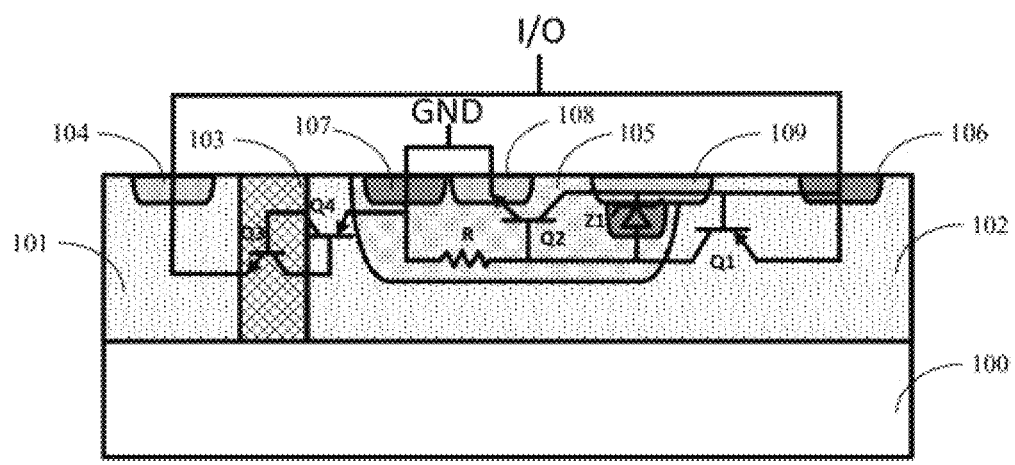
FIG. 2 shows a schematic diagram of an equivalent circuit of a TVS device provided by an embodiment of the present disclosure.
Figure 3:
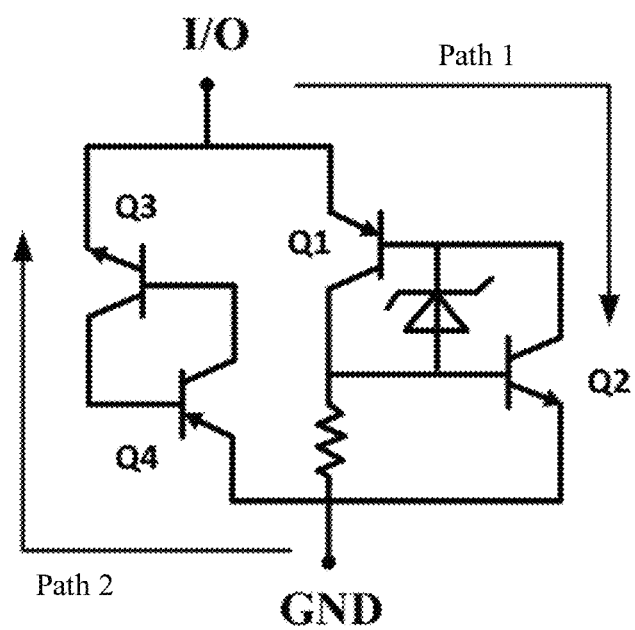
FIG. 3 shows a schematic principle diagram of an equivalent circuit of a TVS device provided by an embodiment of the present disclosure.
Figure 4:
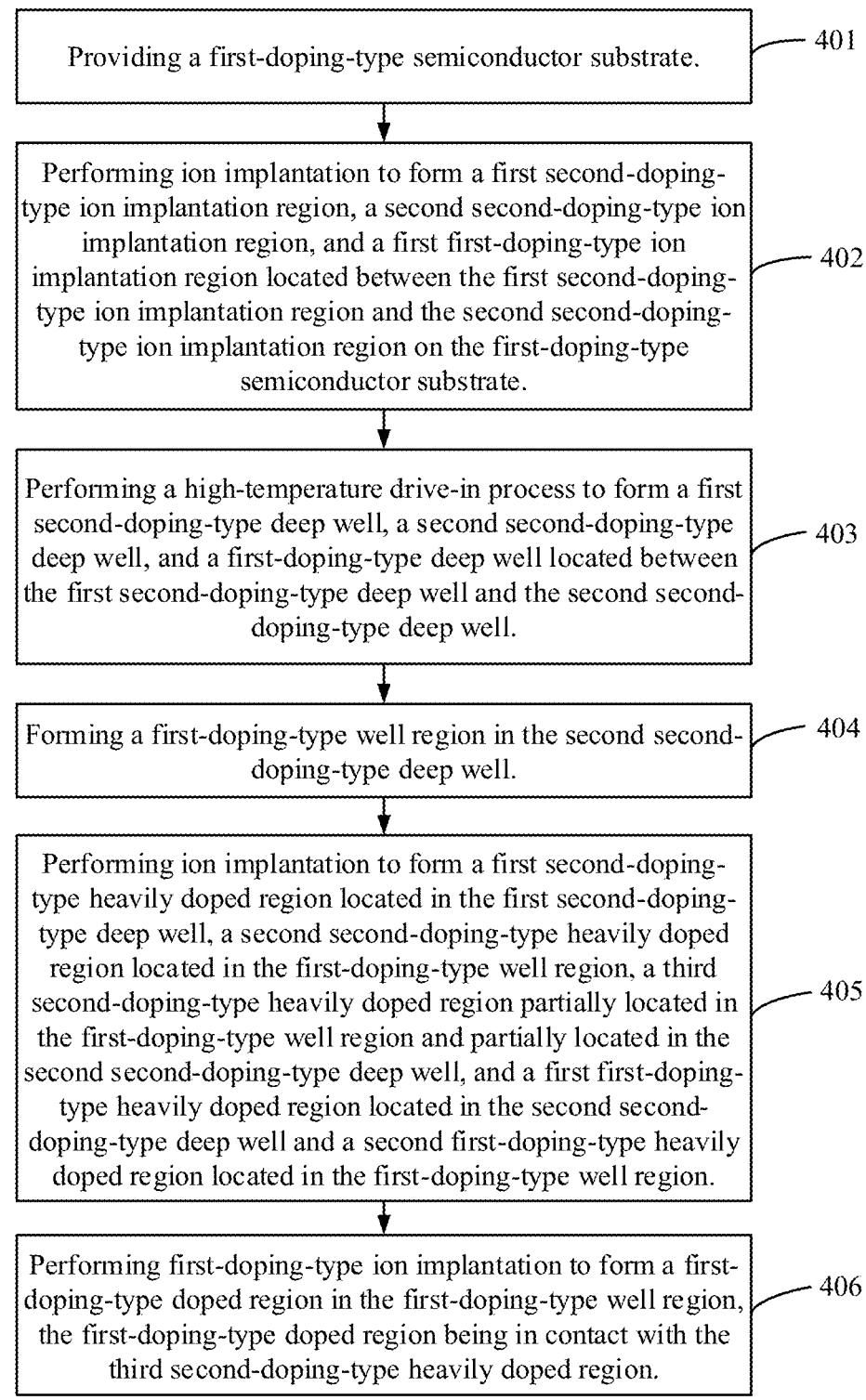
FIG. 4 shows a process flow chart of a manufacturing method for a TVS device provided by an embodiment of the present disclosure.

The equivalent circuit of the TVS device provided by this embodiment is shown in FIG. 2 and FIG. 3.

As shown in FIG. 2, in the second second-doping-type deep well 102, current enters from the first first-doping-type heavily doped region 106, and sequentially passes through the second second-doping-type deep well 102, the third second-doping-type heavily doped region 109, the first-doping-type well region 105, and finally flowing out of the second first-doping-type heavily doped region 107. The second first-doping-type heavily doped region, the second second-doping-type deep well, the third second-doping-type heavily doped region, the first-doping-type well region, and the first first-doping-type heavily doped region constitute a first triode Q1. In this embodiment, the first triode is a PNP triode.

In the second second-doping-type deep well 102, the third second-doping-type heavily doped region 109 and the first-doping-type doped region 110 therebelow constitute a reverse biased Zener diode Z1. By adjusting the breakdown voltage of the Zener diode Z1, TVS products with different voltage levels can be accurately realized. Exemplarily, the breakdown voltage of the Zener diode Z1 can be adjusted by adjusting the doping concentration of the first-doping-type doped region 110. The greater the doping concentration, the greater the breakdown voltage of the Zener diode Z1.

In the second second-doping-type deep well 102, the third second-doping-type heavily doped region 109, the first-doping-type well region 105, and the second second-doping-type heavily doped region 108 constitute a second triode Q2. In this embodiment, the second triode Q2 is an NPN triode.

In the second second-doping-type deep well 102, the current flows through the first-doping-type well region 105 and flows out from the second first-doping-type heavily doped region 107. At this time, the region where the current flows through has a resistance, that is, the first-doping-type well region 105 and the second first-doping-type heavily doped region 107 constitute a resistor R.

The first second-doping-type heavily doped region 104, the first second-doping-type deep well 101, the first-doping-type deep well 103, and the second second-doping-type deep well 102 constitute a third triode Q3 between the first second-doping-type deep well 101, the first-doping-type deep well 103, and the second second-doping-type deep well 102. In this embodiment, the third triode is an NPN triode.

The second first-doping-type heavily doped region 107, the first-doping-type well region 105, the second second-doping-type deep well 102, and the first-doping-type deep well 103 constitute a fourth triode Q4 between the first-doping-type deep well 103 and the second second-doping-type deep well 102. In this embodiment, the fourth triode Q2 is an PNP triode.

When a positive instantaneous pulse signal enters from the input/output terminal, the fourth triode Q4 and the third triode Q3 constitute a first thyristor, and the trigger voltage of the first thyristor is determined by the width and doping concentration of the first-doping-type deep well between the third triode Q3 and the fourth triode Q4.

For an application voltage of 5 V, optionally, the width of the first-doping-type deep well 103 is 5 um to 10 um, and the doping concentration thereof is 1E14 cm$^{-3}$ to 1E15 cm$^{-3}$. When a negative instantaneous pulse signal enters from the input/output terminal, the third triode Q3 and the fourth triode Q4 constitute a second thyristor, and the trigger voltage of the second thyristor needs to be less than the reverse biased breakdown voltage of the first triode Q1. The first triode Q1 and the second triode Q2 constitute a third thyristor. In this embodiment, the third thyristor is a PNPN thyristor. The trigger voltage of the third thyristor is determined by the breakdown voltage of the Zener diode Z1. For an application voltage of 5 V, optionally, the breakdown voltage of the Zener diode Z1 is 6 V to 8 V.

As shown in FIG. 3, when the positive instantaneous pulse signal enters from the I/O interface, the fourth triode Q4 and the third triode Q3 constitute the first thyristor. Since the trigger voltage set by the first thyristor is higher than the breakdown voltage of the Zener diode Z1, the Zener diode Z1 is broken down first, the first triode Q1 is turned on, and the avalanche current or Zener current generated by the Zener diode Z1 flows to the second first-doping-type heavily doped region 107. Under the action of the positive instantaneous pulse signal, the current density continues to increase. Since the resistor R will produce a voltage drop, when the voltage drop reaches a certain level, the second triode Q2 will be turned on, at this time, the PNPN thyristor consists of the first triode Q1 and the second triode Q2 is completely turned on, and the flow path 1 of the pulse current is shown in FIG. 3. Since the holes and electrons conduct together at this time, the conductivity modulation effect produced by them causes the resistance value to be very small, a larger pulse current can therefore be withstood.

When the negative instantaneous pulse signal enters from the I/O interface, the third triode Q3 and the fourth triode Q4 constitute the second thyristor. Since the trigger voltage set by the second thyristor is lower than the reverse biased breakdown voltage of the first triode Q1, the pulse signal flows into GND through the third triode Q3 and the fourth triode Q4. At this time, since a thyristor has a stronger current capacity than a conventional PN junction and has a smaller capacitance, the current discharge capability of the TVS device is improved and the capacitance of the device is reduced.

The TVS device provided by the present disclosure has simple structure, low cost, good isolation effect, high ESD robustness, and easily integrated, and a parasitic SCR is used to replace a conventional PN junction forward diode, thus its current discharge capability is stronger and capacitance is smaller.

Hereinafter, a manufacturing method for a TVS device according to an implementation of the present disclosure will be described in detail with reference to FIG. 4 and FIGS. 5A-5E. The manufacturing method for a TVS device described hereinafter can be used to manufacture the above described TVS device. In this embodiment, the description is made with the first doping type being P type and the second doping type being N type.

Figure 5A:
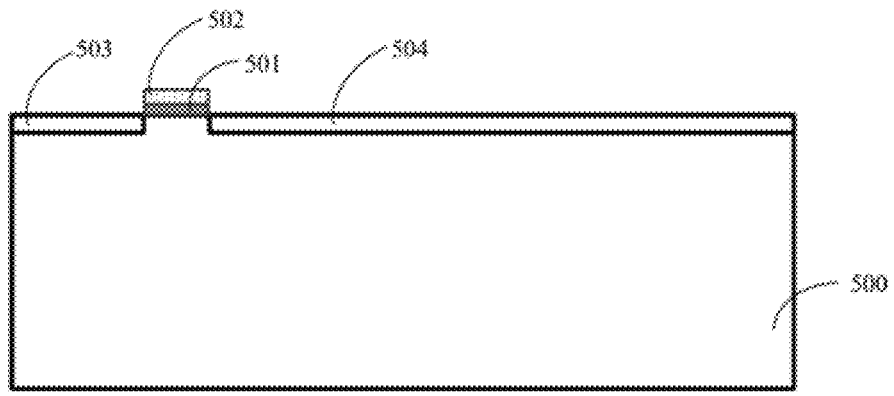
FIGS. 5A-5E are schematic cross-sectional views of devices respectively obtained by sequentially implementing steps of a method according to an embodiment of the present disclosure.

First, step 401 is performed, as shown in FIG. 5A, a first-doping-type semiconductor substrate 500 is provided.

The constituent material of the semiconductor substrate 500 may include semiconductor elements, such as silicon or silicon germanium with a single crystal, polycrystalline, or amorphous structure, and may also include mixed semiconductor structures, such as silicon carbide, indium antimonide, indium arsenide, indium phosphide, gallium arsenide or gallium antimonide, alloy semiconductor, or a combination thereof, or may be Silicon-On-Insulator (SOI), or the like. Exemplarily, the P type semiconductor substrate is a P type lightly doped substrate, that is, a P-substrate.

Step 402 is performed, ion implantation is performed to form a first second-doping-type ion implantation region, a second second-doping-type ion implantation region, and a first first-doping-type ion implantation region located between the first second-doping-type ion implantation region and the second second-doping-type ion implantation region on the first-doping-type semiconductor substrate.

In an embodiment, firstly, a mask covering the P type doped region is formed and N type ion implantation is performed to form a first N type doped region and a second N type doped region, and then, a mask covering the N type doped region is formed and P type ion implantation is performed to form a P type doped region. In another embodiment, P type ion implantation may be performed first, and then N type ion implantation is performed.

Illustratively, first, as shown in FIG. 5A, a first mask layer covering the semiconductor substrate 500 is formed. Exemplarily, the first mask layer includes a silicon nitride layer 502, and its formation method includes but is not limited to Physical Vapor Deposition (PVD), Chemical Vapor Deposition (CVD), Atomic Layer Deposition (ALD), or the like. Exemplarily, before forming the silicon nitride layer 502, the formation method further includes growing a sacrificial oxide layer 501 on a surface of the semiconductor substrate 500.

Next, the first mask layer is etched to form an N type implantation window. A photoresist layer may be formed on the first mask layer by a spin coating process, and then the photoresist layer is patterned by processes such as exposure and development to define the N type implantation window. Next, the first mask layer in an exposure area is removed by a wet etching process to expose the semiconductor substrate 500 therebelow.

Next, N type ion implantation is performed to form a first second-doping-type ion implanted region 503 and a second second-doping-type ion implanted region 504.

Figure 5B:
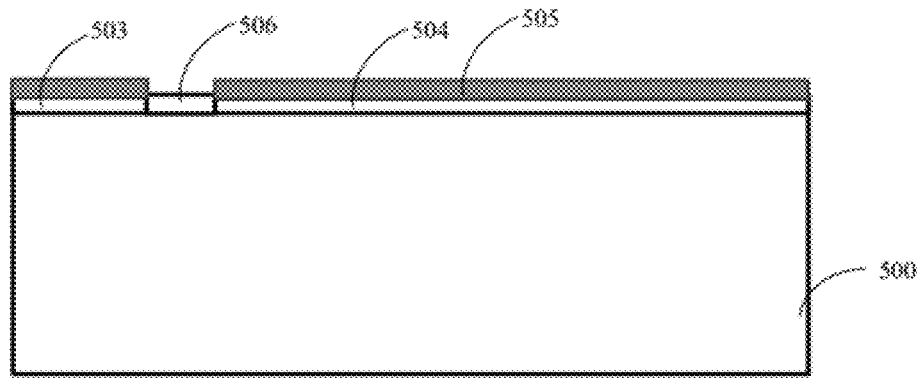

Next, as shown in FIG. 5B, a second mask layer covering the first second-doping-type ion implanted region 503 and the second second-doping-type ion implanted region 504 is formed, and the first mask layer is removed. Exemplarily, an oxide layer 505 may be grown above the first second-doping-type ion implanted region 503 and the second second-doping-type ion implanted region 504 as the second mask layer, and the oxide layer 505 is not grown in other regions due to the coverage of the silicon nitride layer 502. Next, P type ion implantation is performed using the oxide layer 505 as a barrier layer to form a first first-doping-type ion implanted region 506.

Figure 5C:
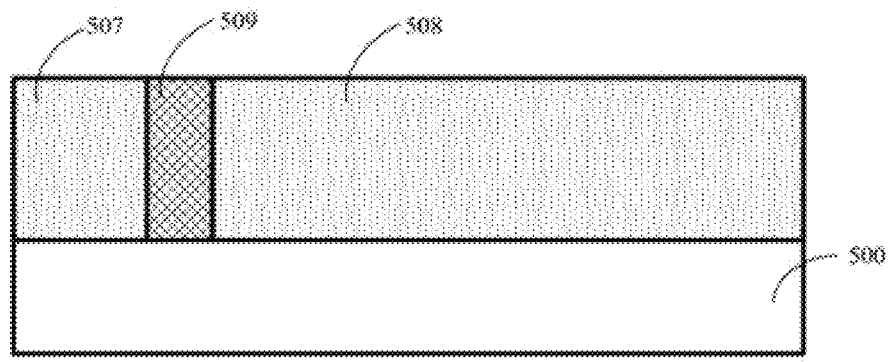

Next, step 403 is performed. As shown in FIG. 5C, a high-temperature drive-in process is performed to form a first second-doping-type deep well 507, a second second-doping-type deep well 508, and a first-doping-type deep well 509 located between the first second-doping-type deep well 507 and the second second-doping-type deep well 508.

Since the first second-doping-type deep well 507, the second second-doping-type deep well 508, and the first-doping-type deep well 509 are simultaneously formed by high-temperature drive-in, the parasitic capacitance of the device can be further reduced, and the lateral expansion sizes of the second-doping-type deep well and the first-doping-type deep well can be reduced, the integration area of the TVS chip can be significantly reduced, and the process flow is reduced and the process cost is reduced. The junction depths of the first second-doping-type deep well 507, the second second-doping-type deep well 508, and the first-doping-type deep well 509 can be adjusted by adjusting the process time and temperature of the high-temperature drive-in process. The longer the process time and the higher the temperature, the greater the junction depth. Exemplarily, the temperature of the high-temperature drive-in process is 1100° C. to 1200° C., and the time there of is 200 min to 400 min. The junction depths of the formed first second-doping-type deep well 507, the second second-doping-type deep well 508, and the first-doping-type deep well 509 are 5 um to 15 um.

Figure 5D:
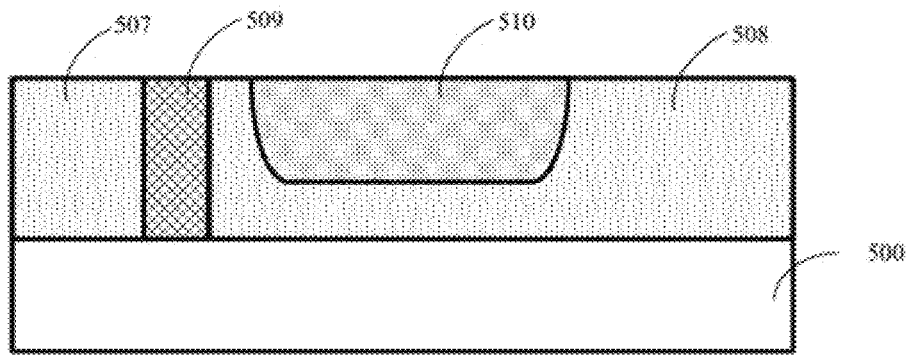

Next, step 404 is performed, as shown in FIG. 5D, a first-doping-type well region 510 is formed in the second second-doping-type deep well 508.

In an embodiment, a method for forming the first-doping-type well region 510 includes: sequentially perform a photolithography process and ion implantation to form a second first-doping-type ion implanted region in the second second-doping-type deep well 508; perform a high-temperature drive-in process to form the first-doping-type well region 510. The junction depth of the first-doping-type well region 510 can be adjusted by adjusting the process time and temperature of the high-temperature drive-in process. The longer the process time and the higher the temperature, the greater the junction depth. The junction depth of the first-doping-type well region 510 needs to be smaller than the junction depths of the first second-doping-type deep well 507, the second second-doping-type deep well 508, and the first-doping-type deep well 509. Exemplarily, the implantation dose of the ion implantation is between 1E13 cm$^{-3}$ to 1E14 cm$^{-3}$, the process temperature of the high-temperature drive-in is 1100° C. to 1200° C., and the time there of is 90 min to 180 min.

Figure 5E:
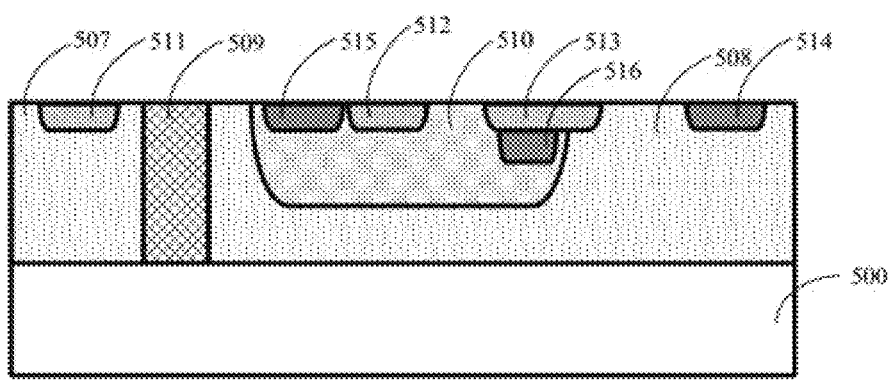

Next, step 405 is performed. As shown in FIG. 5E, ion implantation is performed to form a first second-doping-type heavily doped region 511 located in the first second-doping-type deep well 507, a second second-doping-type heavily doped region 512 located in the first-doping-type well region 510, a third second-doping-type heavily doped region 513 partially located in the first-doping-type well region 510 and partially located in the second second-doping-type deep well 508, and a first first-doping-type heavily doped region 514 located in the second second-doping-type deep well 508 and a second first-doping-type heavily doped region 515 located in the first-doping-type well region 510.

In an embodiment, N type ion implantation is firstly performed to form the first second-doping-type heavily doped region 511 located in the first second-doping-type deep well 507, the second second-doping-type heavily doped region 512 located in the first-doping-type well region 510, and the third second-doping-type heavily doped region 513 partially located in the first-doping-type well region 510 and partially located in the second second-doping-type deep well 508. Next, P type ion implantation is performed to form the first first-doping-type heavily doped region 514 located in the second second-doping-type deep well 508 and the second first-doping-type heavily doped region 515 located in the first-doping-type well region 510. In another embodiment, the P type ion implantation may be performed first, and then the N type ion implantation may be performed, and the sequence thereof is not limited here.

Next, step 406 is performed, first-doping-type ion implantation is performed to form a first-doping-type doped region 516 in the first-doping-type well region 510, and the first-doping-type doped region 516 is in contact with the third second-doping-type heavily doped region 513.

In an embodiment, the first-doping-type doped region 516 is formed under the third second-doping-type heavily doped region 513. Specifically, firstly, photolithographic exposure is performed on the first-doping-type doped region to form an ion implantation window. Next, P type doping ion implantation is performed. Illustratively, firstly, phosphorous ions with a dosage of $1E13$ $cm^{-3}$ to $1E14$ $cm^{-3}$ are implanted, and then boron ions with a dosage of $1E14$ $cm^{-3}$ to $1E15$ $cm^{-3}$ are implanted, and the energy of the implantations is 100 Key to 300 Key. Then, an annealing process is performed to activate the implanted doping ions. The temperature of the annealing process is, for example, 800° C. to 950° C., and the time thereof is, for example, 15 min to 60 min. The higher the temperature and the longer the time of the annealing process, the higher the breakdown voltage of the device.

Finally, a dielectric layer is deposited, photolithographic exposure is performed on a contact hole region, and the dielectric layer in an exposure region is dry etched to form the contact hole region, then a metal layer is deposited, and photolithography and exposure are performed on the metal layer, and the metal in the exposure region is dry etched to form a metal interconnection line. The resistance of the metal interconnection line can be adjusted by adjusting the thickness of the metal layer. As an example, when the metal layer is aluminum, its thickness is 2 um to 4 um. Finally, a passivation layer is deposited, photolithography and exposure are performed on the passivation layer, and the passivation layer in the exposure region is etched to form a metal electrode lead.

At this point, the introduction of the relevant steps of the manufacturing method for a semiconductor device of the embodiment of the present disclosure is completed. It can be understood that the manufacturing method for a semiconductor device of this embodiment not only includes the above steps, but may further include other required steps before, during or after the above steps, and these are all included in the scope of the manufacturing method of this embodiment.

In the manufacturing method provided by the present disclosure, the high-temperature drive-in is used to simultaneously form a deep N well and a deep P well, which can not only further reduce the parasitic capacitance of the device, but also can reduce the horizontal expansion size of the deep well, significantly reduce the integration area of the TVS chip, and effectively reduce the manufacturing cost.

The present disclosure has been described through the above embodiments, but it should be understood that, the above embodiments are merely for the purpose of illustration and description, and are not intended to limit the present disclosure to the scope of the described embodiments. In addition, those skilled in the art can understand that, the present application is not limited to the above described embodiments, further variations and modifications can be made according to the teachings of the present disclosure, and these variations and modifications all fall within the claimed protection scope of the present disclosure. The protection scope of the present disclosure is defined by the appended claims and equivalent scope thereof.

What is claimed is:

1. A Transient Voltage Suppressor (TVS) device, comprising:
 a first-doping-type semiconductor substrate;
 a first second-doping-type deep well and a second second-doping-type deep well disposed on the first-doping-type semiconductor substrate, and a first-doping-type deep well located between the first second-doping-type deep well and the second second-doping-type deep well;
 a first second-doping-type heavily doped region disposed in the first second-doping-type deep well;
 a first-doping-type well region and a first first-doping-type heavily doped region disposed in the second second-doping-type deep well;
 a second first-doping-type heavily doped region and a second second-doping-type heavily doped region disposed in the first-doping-type well region;
 a third second-doping-type heavily doped region partially located in the first-doping-type well region and partially located in the second second-doping-type deep well; and
 a first-doping-type doped region disposed in the first-doping-type well region and in contact with the third second-doping-type heavily doped region;
 wherein, the first-doping-type and the second-doping-type are opposite.

2. The TVS device according to claim 1, wherein the first second-doping-type heavily doped region and the first first-doping-type heavily doped region are connected to an input/output terminal, and the second first-doping-type heavily doped region and the second second-doping-type heavily doped region are connected to a ground terminal.

3. The TVS device according to claim 1, wherein the first first-doping-type heavily doped region, the second second-doping-type deep well, the third second-doping-type heavily doped region, the first-doping-type well region, and the second first-doping-type heavily doped region constitute a first triode;
 the third second-doping-type heavily doped region and the first-doping-type doped region constitute a Zener diode;
 the third second-doping-type heavily doped region, the first-doping-type well region, and the second second-doping-type heavily doped region constitute a second triode;
 the first second-doping-type heavily doped region, the first second-doping-type deep well, the first-doping-type deep well, and the second second-doping-type deep well constitute a third triode;
 the second first-doping-type heavily doped region, the first-doping-type well region, the second second-doping-type deep well, and the first-doping-type deep well constitute a fourth triode; and
 the first-doping-type well region and the second first-doping-type heavily doped region constitute a resistor.

4. The TVS device according to claim 3, wherein when a positive instantaneous pulse signal enters from an input/output terminal, the fourth triode and the third triode constitute a first thyristor, and a trigger voltage of the first thyristor is higher than a breakdown voltage of the Zener diode.

5. The TVS device according to claim 3, wherein when a negative instantaneous pulse signal enters from the input/output terminal, the third triode and the fourth triode constitute a second thyristor, and a trigger voltage of the second thyristor is less than a reverse biased breakdown voltage of the first triode.

6. The TVS device according to claim 4, wherein the breakdown voltage of the Zener diode is 6 V to 8 V.

7. The TVS device according to claim 1, wherein the first-doping-type doped region is located below the third second-doping-type heavily doped region.

8. The TVS device according to claim 1, wherein doping ions of the first second-doping-type heavily doped region comprises arsenic ions and phosphorus ions, and a doping concentration of the arsenic ions is $5E15$ $cm^{-3}$ to $1E16$ $cm^{-3}$, and a doping concentration of the phosphorus ions is $1E14$ $cm^{-3}$ to $1E15$ $cm^{-3}$.

9. The TVS device according to claim 1, wherein doping ions of the first-doping-type doped region comprises phosphorus ions and boron ions, and a doping concentration of the phosphorus ions is $1E13$ $cm^{-3}$ to $1E14$ $cm^{-3}$, and a doping concentration of the boron ions is $1E14$ $cm^{-3}$ to $1E15$ $cm^{-3}$.

10. The TVS device according to claim 1, wherein a doping concentration of the first-doping-type well region is $1E13$ $cm^{-3}$ to $1E14$ $cm^{-3}$, and a doping concentration of doping ions of the first first-doping-type heavily doped region is $1E15$ $cm^{-3}$ to $1E16$ $cm^{-3}$.

11. The TVS device according to claim 1, wherein the first-doping-type is P type and the second-doping-type is N type.

12. A manufacturing method for a TVS device, comprising:
   providing a first-doping-type semiconductor substrate;
   performing ion implantation to form a first second-doping-type ion implantation region, a second second-doping-type ion implantation region, and a first first-doping-type ion implantation region located between the first second-doping-type ion implantation region and the second second-doping-type ion implantation region on the first-doping-type semiconductor substrate;
   performing a high-temperature drive-in process to form a first second-doping-type deep well, a second second-doping-type deep well, and a first-doping-type deep well located between the first second-doping-type deep well and the second second-doping-type deep well;
   forming a first-doping-type well region in the second second-doping-type deep well;
   performing ion implantation to form a first second-doping-type heavily doped region located in the first second-doping-type deep well, a second second-doping-type heavily doped region located in the first-doping-type well region, a third second-doping-type heavily doped region partially located in the first-doping-type well region and partially located in the second second-doping-type deep well, and a first first-doping-type heavily doped region located in the second second-doping-type deep well and a second first-doping-type heavily doped region located in the first-doping-type well region; and
   performing first-doping-type ion implantation to form a first-doping-type doped region in the first-doping-type well region, the first-doping-type doped region being in contact with the third second-doping-type heavily doped region.

13. The manufacturing method according to claim 12, wherein a method of forming the first-doping-type well region comprises:
   performing ion implantation to form a second first-doping-type ion implanted region in the second second-doping-type deep well; and
   performing a high-temperature drive-in process to form the first-doping-type well region.

14. The manufacturing method according to claim 12, wherein after the step of forming the first-doping-type doped region, the manufacturing method further comprises:
   performing an annealing process to activate doping ions.

15. The manufacturing method according to claim 12, wherein the step of forming the first second-doping-type ion implanted region, the second second-doping-type ion implanted region, and the first first-doping-type ion implanted region comprises:
   forming a first mask layer covering the semiconductor substrate;
   etching the first mask layer to form a second-doping-type implantation window;
   performing second-doping-type ion implantation to form the first second-doping-type ion implanted region and the second second-doping-type ion implanted region;
   forming a second mask layer covering the first second-doping-type ion implanted region and the second second-doping-type ion implanted region, and removing the first mask layer; and
   performing first-doping-type ion implantation using the second mask layer as a mask to form the first first-doping-type ion implanted region.

* * * * *